United States Patent [19]

Mundt et al.

[11] Patent Number: 4,578,128
[45] Date of Patent: Mar. 25, 1986

[54] PROCESS FOR FORMING RETROGRADE DOPANT DISTRIBUTIONS UTILIZING SIMULTANEOUS OUTDIFFUSION OF DOPANTS

[75] Inventors: Randall S. Mundt; Ray E. Wyatt, both of Colorado Springs, Colo.

[73] Assignee: NCR Corporation, Dayton, Ohio

[21] Appl. No.: 677,636

[22] Filed: Dec. 3, 1984

[51] Int. Cl.$^4$ .................. H01L 21/20; H01L 21/225
[52] U.S. Cl. ..................................... 148/191; 29/571; 29/576 B; 29/576 W; 148/187; 148/175; 156/643; 357/42; 357/50
[58] Field of Search .............. 29/571, 576 B, 576 W; 148/187, 191, 175; 156/643; 357/42, 50

[56] References Cited

U.S. PATENT DOCUMENTS

| | | | |
|---|---|---|---|
| 3,298,880 | 1/1967 | Takagi et al. | 148/191 |
| 3,635,773 | 1/1972 | Thire | 148/191 |
| 3,767,487 | 10/1973 | Steinmaier | 148/191 |
| 3,921,283 | 11/1975 | Shappir | 29/571 |
| 4,032,372 | 6/1977 | Vora | 148/191 X |
| 4,411,058 | 10/1983 | Chen | 29/571 |
| 4,463,493 | 8/1984 | Momose | 29/571 X |
| 4,466,171 | 8/1984 | Jochems | 29/571 X |
| 4,516,316 | 5/1985 | Haskell | 29/576 B |
| 4,535,529 | 8/1985 | Jochems | 29/571 |

OTHER PUBLICATIONS

Chen, "Quadruple-Well CMOS for VLSI Technology", IEEE Transactions on Electron Devices, vol. ED-31, No. 7, Jul. 1984, pp. 910-919.
Manoliu et al., "High-Density and Reduced Latchup Susceptibility CMOS Technology for VLIS", IEEE Electron Device Letters, vol. EDL-4, No. 7, Jul. 1983, pp. 233-235.

*Primary Examiner*—William G. Saba
*Attorney, Agent, or Firm*—Wilbert Hawk, Jr.; Casimer K. Salys

[57] ABSTRACT

A retrograde dopant distribution is provided in a semiconductor substrate by the combined use of indiffusion and surface outdiffusion and without the use of high energy implants or buried epitaxial layers. The retrograde dopant distribution is provided both in the n-well and the p-well regions to a depth sufficient to accommodate deep trench isolation structures.

8 Claims, 8 Drawing Figures

PROCESS FOR FORMING RETROGRADE DOPANT DISTRIBUTIONS UTILIZING SIMULTANEOUS OUTDIFFUSION OF DOPANTS

BACKGROUND OF THE INVENTION

The present invention relates to a simplified process for forming retrograde dopant distributions in integrated circuit structures, that is, dopant distributions which increase in a vertically inward or downward direction from the surface of a layer or body such as a semiconductor substrate. As used here in reference to the present invention, the word "retrograde" also connotes a controlled dopant profile.

The potential advantages of a retrograde dopant distribution in semiconductor substrates are several, particularly in CMOS integrated circuit structures. The advantages are well-known and include the potential for increased device packing density and decreased susceptibility to latchup. It is believed there are available basically three approaches for forming a retrograde dopant profile. The techniques, namely, high energy implants (greater than about 200 keV), buried epitaxial layers, and outdiffusion, can be used separately or in combination.

An example of retrograde processing techniques is disclosed in Manoliu et al, "High-Density and Reduced Latchup Susceptibility of CMOS Technology for VLSI", *IEEE Electron Device Letters*, Vol. EDL-4, No. 7, July, 1983, pp. 233–235. Manoliu et al. uses the combination of a first implant in a doped substrate and a later implant in an undoped epitaxial layer. The well formation process is concluded with an anneal cycle. The specific CMOS structure and epitaxial buried layer retrograde p-well structure reportedly increases circuit density by reducing the minimum $n_+ - p^+$ spacing while decreasing latchup susceptibility.

Chen, "Quadruple-Well CMOS for VLSI Technology", *IEEE Transactions on Electron Devices*, Vol. ED-31, No. 7, July 1984, pp. 910–919, describes a process for forming a retrograde, quadruple-well CMOS structure. The n-well and p-well retrograde doping profiles each require multiple doping steps. Essentially, the structure is a two-well structure in which deep n-type and p-type wells are separated by respective shallow n-type and p-type wells or channel stops. The shallow wells are implanted through a peripheral field oxide during the deep well implantation. Overall, the Chen process involves, first, forming deep-well windows in a planar field oxide. The p-well region is masked and a high energy phosphorus implant at 290 keV is done in the presence of the mask to define the deep n-well and the adjacent shallow n-type channel stop under the oxide. The n-well is then counter-doped with boron for threshold voltage adjustment.

After the two-implant-step formation of the retrograde n-well, the n-well is masked and a multiple doping sequence is applied to provide the p-well retrograde profile. Initially, a 120 keV boron implant is used to form a relatively deep p-well, and the adjacent shallow p-type channel stop under the oxide. Phosphorus counterdoping adjusts the n-channel threshold voltage. Then, a deep, high energy 340 keV boron implant provides the deep retrograde p-well profile which is used to eliminate latchup. The counter-doping aspects of the process i.e., the combination of high energy implants and opposite conductivity low energy counter-doping, are also disclosed in Chen, U.S. Pat. No. 4,411,058, issued Oct. 25, 1983.

The outdiffusion of semiconductor dopants from the surfaces of silicon, mentioned above, is another well-known phenomenon, one that in the past has produced undesirable results. For example, outdiffusion from the front and rear major surfaces of semiconductor wafers leads to both macro-outdoping and micro-autodoping. Various process techniques are used to eliminate or decrease the effects of outdiffusion, including two-step processing using process interruption and/or high and low temperatures, and sealing of wafer surfaces with a mask such as silicon, silicon dioxide or silicon nitride.

Recently, outdiffusion has been used advantageously to provide a retrograde dopant distribution, but the process techniques for implementing the outdiffusion-caused retrograde dopant distribution typically are complex. For example, Steinmaier, U.S. Pat. No. 3,767,487 relates to the use of outdiffusion techniques to form selected, isolated retrograde surface-adjacent regions which are used as isolation wells for MOS or bi-polar devices. Referring to FIG. 1, the MOS integrated circuit process disclosed in the Steinmaier '487 patent involves forming a five-micron thick n-type epitaxial layer 11 on a p-type semiconductor 10; forming a thermal oxide masking layer 12 over the epitaxial layer having an aperture 13 which defines the p-well or isolation region; depositing a shallow p-well 14 in the surface of the epitaxial layer at the masked apertures using an oxidizing atmosphere to re-cover (not shown) the exposed substrate surface regions; etching the oxide mask to reexpose the epitaxial layer over part of the deposited impurity region beneath the masked windows; and outdiffusing the boron via the mask apertures 13 in a vacuum ampul containing silicon to provide the retrograde concentration in region 14. In particular, the vertical retrograde dopant concentration in region 14, that is, the relatively low surface concentration there, provides a high breakdown voltage for the NMOS device which is subsequently formed in the p-well 14. In addition, in the surface region 16 surrounding the well 14, the mask prevents outdiffusion, thereby providing a surface region 16 of relatively high doping concentration surrounding the retrograde well 14. This horizontal dopant concentration gradient is used to prevent short circuits between the epitaxial layer 11 and the subsequently formed NMOS device.

As is evident from the above description, in regard to small geometry, high density structures, the Steinmaier '487 retrograde p-well fabrication process suffers from several disadvantages in addition to complexity. The shallow retrograde p-well 14 does not appear to be capable of providing the desirable retrograde dopant gradient along the deep isolation trenches which are used in some CMOS structures. The adjacent n-well 17 is capped during the outdiffusion step and does not have a retrograde dopant concentration gradient. Furthermore, the lateral dopant concentration gradient at the periphery of the p-well 14 quite obviously limits the minimum dimension of, and spacing between, the wells. In short, the complex processing of the Steinmaier '487 patent is tailored to provide a p-well-only retrograde gradient and a lateral doping gradient that are inconsistent with small geometry, high density integrated circuits.

Shappir, U.S. Pat. No. 3,921,283 uses surface outdiffusion in the fabrication of dielectrically isolated MOSFET semiconductor devices. Referring to FIG. 2, in the illustrated process an n-type bulk substrate 20 is masked using an oxide 21-nitride 22 composite. Initially, the composite mask is used to etch trenches which are then filled with thermal oxide to provide a trench isolation structure for the NMOS active area 24 and the PMOS active area 25. Next, the mask 21-22 is removed from the NMOS device active area. The NMOS p-well 26 is then formed using both the trench oxide 23 and the mask 20-21 over the PMOS device 25 as implant/doping masks. The mask is retained over the n-well for the PMOS device active area and the semiconductor integrated circuit structure is heated in the presence of silicon powder to simultaneously indiffuse and outdiffuse boron p-well 26 to provide a retrograde dopant distribution in the p-well. There is no disclosure of forming a retrograde profile in n-well 28 or of doping this in combination with the retrograde p-well. In particular, there is no teaching of an a single mask, integrated, epitaxial process particularly suited for decreasing latchup susceptibility.

Vora, U.S. Pat. No. 4,032,372, issued June 28, 1977, forms bipolar and field effect transistors in individual, outdiffused, retrograde n-type wells or pockets which are formed in a semiconductor substrate. Initially, the surface region of the starting bulk substrate is doped with both arsenic and phosphorus to respective $n^+$ concentrations of about $10^{20}$ and $10^{21}$ atoms/cc. A three micron thick p-type epitaxial layer is then formed over the substrate, and an oxide layer which serves as an outdiffusion cap (and subsequently as the field isolation oxide) is formed on the outer surface of the epitaxial layer. Then, the arsenic and phosphorus are outdiffused until the much faster diffusing phosphorus reaches the outer surface of the oxide capped epi layer, thereby forming an n-type phosphorus pocket which encloses an arsenic buried region within the p-type epi/bulk substrate.

The resulting retrograde vertical concentration gradient provides a relatively heavily doped bottom region for bipolar collector and subcollector structures, and a relatively lightly doped upper region for optimized field effect transistors. However, the vertical retrograde isolation wells or pockets of the Vora '372 patent require a relatively complex fabrication sequence involving the above-described two implant steps and the oxide capping layer, in addition to the epitaxial layer. The phosphorus and the arsenic outdiffusion heating step also establishes a lateral dopant concentration gradient that would undesirably increase the effective lateral dimensions and design spacing of the isolation pockets. The design spacing is increased still further for arsenic concentrations greater than about $10^{21}$ atoms/cc due to lateral spreading of the arsenic along the interface of the epitaxial layer and substrate, and requires the use of arsenic concentrations less than $10^{21}$ atoms/cc, or process compensation. Foremost, the process yields a retrograde distribution in only one of the two impurity regions. Because of these aspects, the Vora '372 retrograde process is believed to be limited to the specific disclosure of combined bipolar/field effect device fabrication, and to integrated circuit structures which require the specific combination of bipolar and FET structures at the expense of device close packing.

In view of the above discussion, it is a primary object of the present invention to implement a retrograde dopant distribution using simple process techniques.

It is another object to provide the above-described retrograde dopant distribution using process techniques which are readily incorporated into existing semiconductor fabrication processes.

It is still another object to provide a process for forming a retrograde dopant distribution, the steps of which are readily incorporated into standard CMOS fabrication sequences to provide advantages such as those listed in the Manoliu et al. article referenced above, including decreased susceptibility to latchup, and to do so for both p and n channel MOS devices without high energy implants, buried layers or complex processing. In addition, in regard to integrated circuit structures using trench dielectric isolation, it is an object to decrease susceptibility to inversion along the trench walls and to do so without high energy implants, buried layers or complex processing.

SUMMARY OF THE INVENTION

In one aspect, the process of the present invention which has the above advantages involves: providing a semiconductor substrate of n-type conductivity; forming a p-type epitaxial surface layer; selectively forming a low energy, surface-adjacent n-type implant layer in a mask defined n-well region; and uncovering the structure and heating the structure to simultaneously effect a selected extent of indiffusion and outdiffusion to form a retrograde vertical dopant concentration gradient in the n-well and to define an adjacent p-well which also has a retrograde vertical dopant concentration gradient.

In an exemplary working embodiment, the present invention involves: providing a substrate doped with n-type dopant such as antimony to about $6 \times 10^{18}$ cm$^{-3}$; forming an epitaxial silicon layer approximately five microns thick doped with p-impurities such as boron to a concentration of $2 \times 10^{16}$ cm$^{-3}$; selectively masking the epitaxial layer to expose n-well regions, depositing a surface adjacent n-type region using an implant energy of about 150 keV and a dose of $5 \times 10^{13}$ cm$^{-2}$; removing the photoresist; and heating the structure in argon ambient at atmospheric pressure for 10 hours at 1150° C. to form an n-well having a surface concentration of about $5 \times 10^{14}$ atoms per cm$^3$, a concentration of about $8 \times 10^{15}$ atoms per cm$^3$ at one micron depth, and an adjacent p-well having a surface concentration of about $8 \times 10^{14}$ atoms per cm$^3$ and a concentration of about $9 \times 10^{15}$ atoms per cm$^3$ at one micron, and junction depths of about 3.5 microns.

These characteristics are provided without the use of an oxide outdiffusion mask. Also, these characteristics are provided along with a constant horizontal dopant concentration, a deep retrograde vertical gradient in both impurity type wells and with a junction depth which is suitable for accommodating deep trench isolation structures. All of these characteristics are accomplished consistent with the object of not using high energy implants or buried layers.

BRIEF DESCRIPTION OF THE DRAWINGS

The above and other aspects of the present invention are discussed in detail with regard to the following drawings in which.

DETAILED DESCRIPTION OF THE INVENTION

Figure 8:
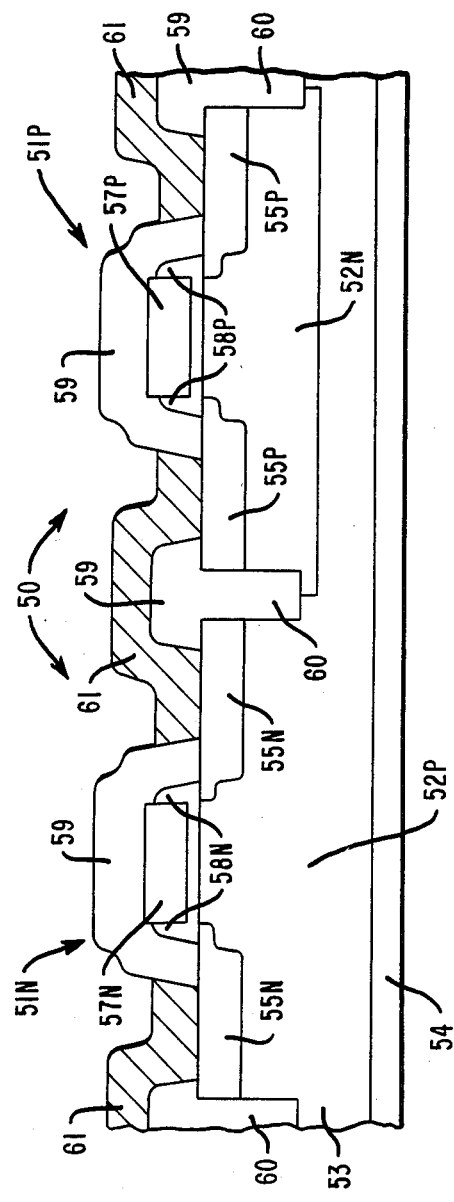
FIG. 8 is a schematic cross-sectional representation of a portion of a CMOS integrated circuit which incorporates the retrograde dopant distribution of the present invention.

FIG. 8 illustrates one example of a CMOS integrated circuit structure 50 which can be made using the dual-well approach of the present invention. The illustrated structure includes a PMOS FET 51P formed in an n-well 52N and an NMOS FET 51N formed in a p-well 52P. The complementary integrated structure 50 is formed in n-type epitaxial layer 53 formed on an integrated circuit semiconductor substrate 54 using VLSI process techniques. The transistors 51P and 51N include source and drain diffusions 55P and 55N in an LDD (lightly doped drain-source) configuration, all of which are self-aligned with the silicon gates 57P and 57N, as well as gate sidewall oxide spacers 58P and 58N, interlevel dielectric layer 59 and aluminum interconnects 61. The PMOS FET 51P and the NMOS FET 52N are electrically isolated from adjacent devices and adjacent active regions, such as one another, in the n-type epitaxial region 53 by trench dielectric isolation structures 60.

In accordance with the present invention, an indiffusion-outdiffusion process is used to form the n-well 52N and p-well 52P and to form a retrograde vertical dopant profile for such wells, in which profile the doping level at a depth within the substrate, indicated by line 63 (FIG. 7), exceeds the doping level at the substrate surface 64. The retrograde profile provides the desired device isolation and the desired trench sidewall doping characteristics without the use of high energy implants or buried epitaxial layers. The process used to form the retrograde profile, described below, is relatively straightforward in that no oxide outdiffusion mask or cap is necessary, there is no horizontal dopant gradient, and the process is readily implemented as shown with trench dielectric isolation structures. Quite obviously, the illustrated structure 50 is only one of the possible applications among the various NMOS, PMOS, CMOS, bipolar and other applications which benefit from a retrograde doping profile with or without substrate-adjacent opposite-conductivity regions and wells and with or without trench dielectric isolation structures. As will be equally obvious to those of usual skill in the art from the discussion below, the invention is applicable to, and readily integrated into, processes for forming such other structures.

Figure 1:
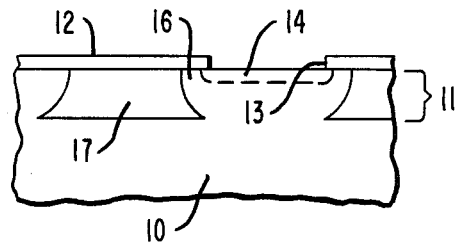
FIGS. 1 and 2 are schematic cross-sectional representations of stages of prior art techniques for forming retrograde substrate dopant concentrations.
Figure 2:
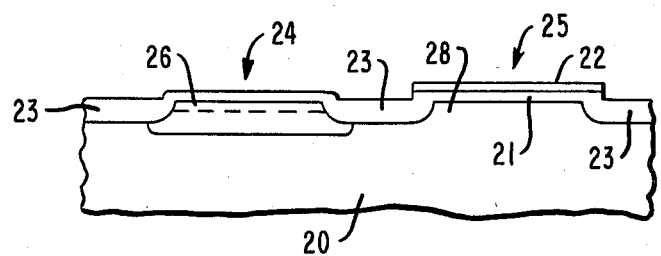
Figure 3:
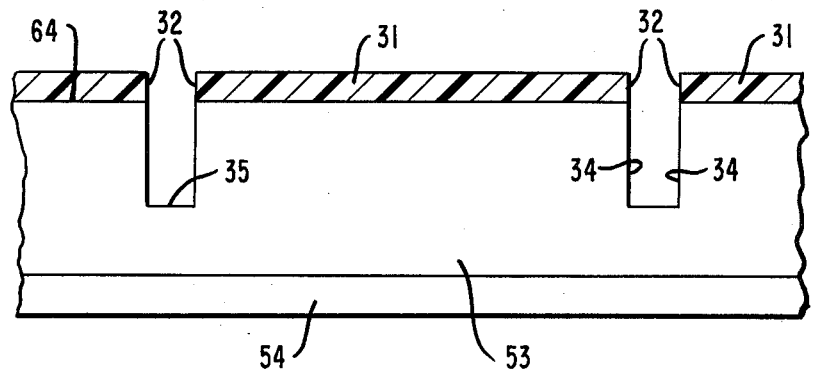
FIGS. 3–7 are schematic cross-sectional representations of a portion of a CMOS integrated circuit during fabrication thereof and in particular showing the sequence of forming the retrograde dopant distribution used therein.

The optimized retrograde dopant gradient fabrication sequence for CMOS well applications starts as shown in FIG. 3 and is precisely accomplished through a sequence of epitaxial silicon growth, ion implantation and a thermal diffusion, which includes surface outdiffusion. The starting structure typically is the n+ bulk silicon substrate of <100> or other orientation which has a resistivity of about 0.007 to 0.02 ohm centimeters. In a particular working embodiment used to form the retrograde dopant distribution dimensions and values shown in FIG. 7, the starting structure is an n+ substrate 54 doped with antimony or other n-type impurity species to a concentration of about $10^{18}$ to $10^{19}$ atoms per cubic centimeter (atoms/cc). Referring to FIG. 3, initially there is formed on the substrate 54 an epitaxial monocrystalline silicon layer 53, typically about five microns thick, which is doped with boron or other p-type impurities to a concentration of about $10^{16}$ to $10^{17}$ atoms/cc. The epi layer 53 can be formed, for example, by a standard non-selective process such as (eliminate) chemical vapor deposition using, e.g., silane or silicon tetrachloride. Although selectivity is unnecessary for epitaxial deposition on the semiconductor substrate 54, as an alternative epitaxial growth process, one of the recently developed selective processes can be used which provides excellent planarity and crystallinity in addition to selectivity. One example of a suitable selective epitaxial growth technique uses $SiH_2Cl_2$-$H_2$ systems, typically with about one volume percent HCl and exemplary temperature and pressure of 1,000° C. and 50 Torr, respectively.

The epitaxial layer 53 is doped either during or after deposition, preferably during deposition by adding the appropriate dopant containing gas compound to the reactant gas system.

Referring further to FIG. 3, next the dielectric isolation trenches are formed. First the substrate 53 is masked using any of a number of materials including silicon nitride, silicon dioxide and combinations thereof, or the exemplary photoresist mask 31. In addition, a mask composition suitable for X-ray or ion beam exposure can be used. Using photo-resist, a layer thereof is formed on the substrate, then is exposed and developed to produce the etch mask 31 having openings 32—32 which correspond to the desired trench locations.

Next, the trenches are etched to a typical depth of about one to six microns, preferably using an anisotropic etch process such as anisotropic plasma etching or reactive ion etching (RIE). This produces a substrate surface topology which includes the generally horizontal substrate outer surface 64 and the generally vertical sidewalls 34—34 and the horizontal bottom walls 35 of the trench. One preferred etch process is reactive ion etching using a fluorine etchant gas such as nitrogen trifluoride ($NF_3$). In such an anisotropic reactive ion etching process, the mechanical component or ion bombardment component dominates the chemical reaction component and provides the vertical sidewalls which are desirable in order to provide minimum lateral width in the subsequently formed dielectric isolation structure 60 (FIG. 5).

Figure 4:
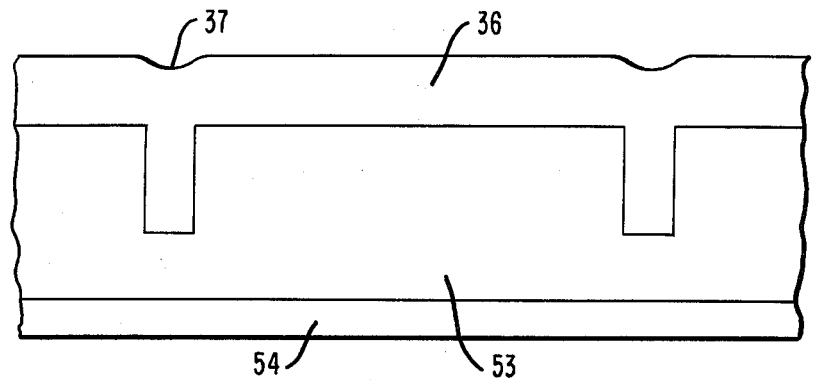

Referring now to FIG. 4, after the trench etching process, the trench mask 31 is removed, such as by plasma ashing, and insulator layer 36 is formed on the substrate surface topography and in the trench. In a working embodiment, the dielectric layer 36 is silicon dioxide glass which is formed to a thickness greater than the trench depth by low temperature, low pressure chemical vapor deposition using the reactant gases silane and oxygen at a temperature of about 500° to 900° C. and a pressure of about 0.1 to 1 Torr. After the oxide formation, the upper surface 37 is chemically etched or mechanically polished back to the planar substrate outer surface 64. In the event the oxide deposition has produced a substantially non-planar outer oxide surface 37, planarization techniques can be applied. One suitable technique involves the spin-on application of a relatively low viscosity organic layer (not shown) on surface 37. The spun material is caused to flow to a relatively smooth surface by the centrifugal force of the application or by a subsequent low temperature bake. Reactive ion etching, which etches the organic material and the oxide at approximately the same rate, is then used to clear the organic layer from the upper surface and thereby replicate the surface smoothness of the organic coating in the outer surface 64 of the epitaxial silicon layer 53 and the trench dielectric oxide structure 60. Of course, if the planarization enhancement is not necessary, the oxide is simply etched back to the epitaxial silicon. In either case, the resultant doped epi layer 53/isolation trench 60 structure is complete, as shown in FIG. 5, and ready for the retrograde dual-well formation.

Figure 5:
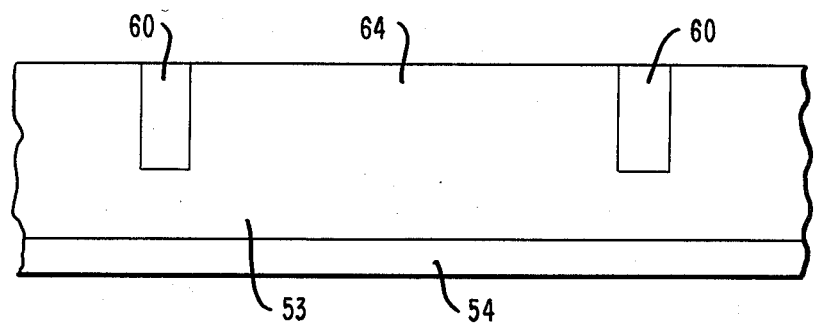
Figure 6:
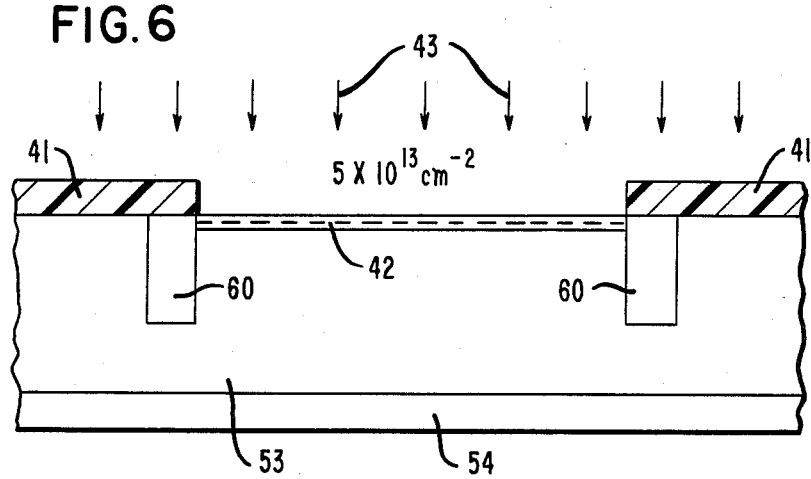
Figure 7:
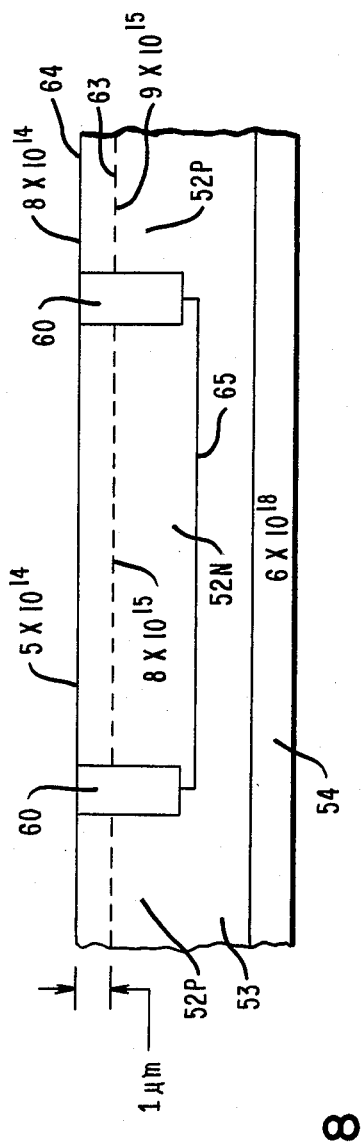

Next, and referring to FIG. 6, the unpatterned trench-isolated epi layer 53 of FIG. 5 is patterned by forming a mask 41 which is the complement of the subsequently formed n-well 52N (FIG. 7). The mask 41 can be formed using conventional ultraviolet photolithographic techniques. As mentioned, a typical process involves the formation of a photoresist layer, selective exposure to ultraviolet radiation in the presence of a mask, followed by developing of the photoresist and dissolving of selected regions. Of course, other masking techniques such as electron beam or X-ray techniques can be used.

Referring further to FIG. 6, next the n-well layer 52N (FIG. 7) is formed by initially depositing a layer 42 of donor impurities in the exposed epitaxial layer 53 in the presence of mask 41. Preferably, this deposition/formation step is done using ion implantation, although furnace diffusion can be used if mask 41 is of the appropriate composition. One suitable sequence for the above-described doping levels and dimensions uses ion implantation for forming the n$^-$ phosphorus surface-adjacent well layer 52N (FIG. 7), and involves implantation of phosphorus ions at 150 keV and a dose of $5 \times 10^{13}$ atoms/cc as indicated schematically at 43. Other n-type species such as arsenic or antimony can be used. However, the relatively low mobility of these two impurities would slow diffusion within the wafer and the required indiffusion and outdiffusion would therefore require longer heating times and/or higher heating temperatures.

Next, and referring to FIG. 7, the photoresist mask 41 is removed, for example, by plasma ashing. With the surface 64 of the substrate epitaxial layer 53 exposed, the integrated circuit structure is then heated, typically using a furnace diffusion cycle to simultaneously outdiffuse and indiffuse the n-type and p-type dopants to provide the desired retrograde dopant profile. For example, for the above-disclosed parameters, heating in an ambient of argon at atmospheric pressure (or in a vacuum under appropriate other parameters) at a temperature of 1150° C. for 10 hours provides the retrograde n-well 52N having a surface concentration of about $5 \times 10^{14}$ atoms/cc, a concentration of about $8 \times 10^{15}$ atoms/cc at a depth of one micron (line 63) and a junction depth of about 3.5 microns (line 65); and an adjacent retrograde p-well having a surface concentration of about $8 \times 10^{14}$ atoms/cc, and a concentration of $9 \times 10^{15}$ atoms/cc at a depth of one micron.

In one form, the present invention involves: providing a substrate 54 doped n+ using an n-type dopant such as antimony to $6 \times 10^{18}$ atoms/cm$^3$; forming a p$^-$ epitaxial silicon layer 53 approximately 5.5 microns thick doped with p-impurities such as boron to a concentration of $2 \times 10^{16}$ atoms/cm$^3$; forming trench isolation structures 60 in the substrate about two microns deep defining the p-well and n-well regions; masking the epitaxial layer to expose n-well regions 52N; depositing a surface-adjacent n-region 42 (FIG. 6) using a low implant energy of about 150 keV and a dose of $5 \times 10^{13}$ cm$^{-2}$; removing the mask; and heating the structure in argon ambient for 10 hours at 1150° C. to form an n-well 52N having a surface concentration of about $4.7 \times 10^{14}$ atoms/cc, a concentration of about $8 \times 10^{15}$ atoms/cc at one micron depth, and an adjacent p-well 52P having a surface concentration of about $8.4 \times 10^{14}$ atoms/cc and a concentration of about $9.3 \times 10^{15}$ atoms/cc at one micron, and well junction depths of about 3.5 microns.

Those of skill in the art will understand that the above parameters and doping distributions are exemplary and will be readily altered to satisfy particular process needs. Furthermore, depending upon the subsequent high temperature processing requirements, the initial dopant concentration profile and outdiffusion heat treatment can be altered to accommodate subsequent high temperature processing.

According to the FIG. 8 example, the structure shown in FIG. 7 is then provided the gate electrodes 57, the LDD source-drain diffusions 55, sidewall oxides 58, interlevel dielectric layers 59 and metallization 61, along with other conductors as required and a final passivation coating. The reader will note that FIG. 7 (and FIGS. 3–6) is positioned to clearly show the n-well implant and full trenches 60 adjacent the n-well 52N, whereas FIG. 8 is translated slightly to show the complete NMOS FET. The result is a slightly different perspective of the same structure. Of course, alternative structures and process techniques will be used. The purpose here is illustration, to provide one example of the use of the dual retrograde p- and n-wells. As one alternative, the retrograde wells can be formed without trench isolation where trenches are not needed. As another alternative, bipolar devices, or combinations of bipolar and MOSFET devices, can be formed in the wells.

As still another alternative, the described process for forming retrograde wells is suited for combination with the vertical sidewall trench isolation technique described in co-pending U.S. application Ser. No. 667,181, filed on Nov. 1, 1984, in the names of Rogers, Mundt and Kaya, which application is assigned in common with the present application. The Rogers et al. application is incorporated by reference. The Rogers et al. process is tailored to provide high quality, vertical sidewall trench isolation structures. The vertical sidewall profile, of course, is highly desirable vis-a-vis the normal slanting sidewall profile in order to minimize the lateral dimensions of the channel stop and the overall trench isolation structure. Using the Rogers et al. process, the trench dielectric 60 is a composite structure comprising, for example, in order from the substrate trench wall, a stress relief thermal oxide layer 300 to 1,000 Angstroms thick; a chemical vapor-deposited polycrystalline silicon (poly) etch stop layer 1,000 to 3,000 Angstroms thick; a chemical vapor-deposited silicon nitride, oxidation-and dopant-blocking layer 1,000 to 3,000 Angstroms thick; and a chemical vapor-deposited silicon oxide isolation layer containing approximately 3 to 9 weight percent dopant such as phosphorus or boron. As deposited, the CVD silicon oxide dielectric fills the trench and covers the substrate. This oxide isolation layer is melted and reflowed at a temperature of about 950° to 1150° C. in steam or nitrogen ambient for a period of approximately 30 minutes to four hours, depending upon the thickness of the dielectric isolation layer and the dimensions of the trench. The oxide dielectric isolation layer is then etched back by an anisotropic etching process such as reactive ion etching using CHF$_3$ etchant gas. During this oxide etch-back, the nitride layer is removed outside the trench regions and the polysilicon etch-stop layer protects the underlying silicon substrate. Subsequently, the dopant is outgassed from the oxide trench isolation dielectric, for example, by heating the structure at 1000° to 1200° C. in a nitrogen ambient for two to eight hours. The polysilicon layer is then removed from the active regions, outside the trench structure. During the two thermal processing steps—the reflow step and the outgassing step—the nitride blocks oxidation and doping of the underlying structure, including the silicon substrate structures for fabricating.

Having thus described the preferred and alternative embodiments of the present outdiffusion process for forming a retrograde dopant distribution, what is claimed is:

1. A process for forming a vertical retrograde dopant distribution in a semiconductor device, comprising:
    providing a substrate of a first conductivity type;
    forming on the substrate an epitaxial layer of the second conductivity type and of selected thickness;
    forming a mask on the epitaxial layer exposing a first well region and a covered second well region;
    doping the surface region of the epitaxial layer in the first well region;
    removing the mask to expose both well regions; and
    heating the structure for a predetermined time and temperature to form by outdiffusion a retrograde dopant distribution of the first conductivity type in the first well region and to form a retrograde dopant distribution of the second conductivity type in the adjacent second well region.

2. The process of claim 1 wherein, prior to forming the mask, a trench dielectric isolation structure is formed between the first and second well regions.

3. The process of claim 2 wherein forming the trench dielectric structure comprises:
    making the substrate to define the trench region;
    etching the trench in the presence of the mask; and
    filling the trench with dielectric material.

4. The process of claims 2 or 3 wherein the process parameters are selected to provide a retrograde dopant concentration encompassing substantially the depth of the trench dielectric structure.

5. A process for forming a vertical retrograde dopant concentration in a semiconductor substrate comprising:
    providing a substrate of n-conductivity type;
    forming on the substrate a p-type epitaxial layer;
    forming trench dielectric isolation structures in the epitaxial layer defining and dielectrically isolating at least first and second device regions in the layer;
    forming a mask on the epitaxial layer exposing a first device region adjacent a covered second device region;
    lightly n-type doping the surface region of the epitaxial layer in the first device region;
    removing the mask; and
    heating the structure for a predetermined time and temperature so that a combination of outdiffusion and indiffusion forms a retrograde dopant distribution of n-type conductivity in the first device region and a retrograde dopant distribution of p-type conductivity in the adjacent second device region.

6. A process for forming a vertical retrograde dopant concentration in a semiconductor substrate comprising:
    providing a substrate of n-conductivity type and concentration about $6 \times 10^{18}$ cm$^{-3}$;
    forming on the substrate a p-type epitaxial layer about five microns thick and of concentration about $2 \times 10^{16}$ cm$^{-3}$;
    forming trench dielectric isolation structures in the epitaxial layer defining and dielectrically isolating at least first and second device regions in the layer;
    forming a mask on the epitaxial layer exposing a first device region adjacent a covered second device region;
    lightly implant doping the surface region of the epitaxial layer in the first device region using n-type dopant and an energy of about 150 keV and a dose of about $5 \times 10^{13}$ cm$^{-2}$;
    removing the mask; and
    heating the structure for a predetermined time and temperature so that a combination of outdiffusion and indiffusion forms a retrograde dopant distribution of n-type conductivity in the first device region and a retrograde dopant distribution of p-type conductivity in the adjacent second device region.

7. The process of claim 6 wherein the outdiffusion and indiffusion heating step involves heating in an inert gas ambient at about 1150° C. for 10 hours.

8. The process of claim 6 wherein the outdiffusion and indiffusion involves heating in a vacuum ambient.

* * * * *